United States Patent [19]
Matsunaga et al.

[11] Patent Number: 5,238,850
[45] Date of Patent: Aug. 24, 1993

[54] BI-MOS TYPE SEMICONDUCTOR INTEGRATED CIRCUIT DEVICE HAVING HIGH-FREQUENCY CHARACTERISTICS AND METHOD OF MAKING THE SAME

[75] Inventors: Taira Matsunaga, Kawasaki; Bunshiro Yamaki, Fujisawa, both of Japan

[73] Assignee: Kabushiki Kaisha Toshiba, Kawasaki, Japan

[21] Appl. No.: 903,741

[22] Filed: Jun. 25, 1992

[30] Foreign Application Priority Data

Jun. 27, 1991 [JP] Japan .................................. 3-157057

[51] Int. Cl.$^5$ .................... H01L 21/265; H01L 27/02
[52] U.S. Cl. ......................................... 437/40; 437/20; 437/63; 437/162; 437/192; 437/193; 437/233; 437/235; 437/248; 257/378; 257/382
[58] Field of Search ................ 357/43, 59; 437/15, 437/20, 40, 63, 162, 192, 193, 233, 235, 248; 257/378, 382

[56] References Cited

U.S. PATENT DOCUMENTS

| | | | |
|---|---|---|---|
| 4,978,626 | 12/1990 | Poon et al. | 357/59 |
| 4,984,042 | 1/1991 | Pfiester et al. | 357/59 |
| 5,023,690 | 6/1991 | Verret et al. | 357/43 |
| 5,148,252 | 9/1992 | Taka | 357/54 |

*Primary Examiner*—Edward Wojciechowicz
*Attorney, Agent, or Firm*—Oblon, Spivak, McClelland, Maier & Neustadt

[57] ABSTRACT

A Bi-MOS type semiconductor integrated circuit device having at least one bipolar transistor in an island region is provided. The island region is covered with a multilayer insulating film which is formed of a silicon oxide film and a silicon nitride film having a different etching resistance with each other. Collector and base contact holes and an intended emitter contact hole are formed in the multilayer insulating film at the same time to provide bipolar transistors having a fine structure. An insulated gate MOS transistor includes a protective film such as polysilicon film covering a gate insulating film to increase the reliability.

8 Claims, 10 Drawing Sheets

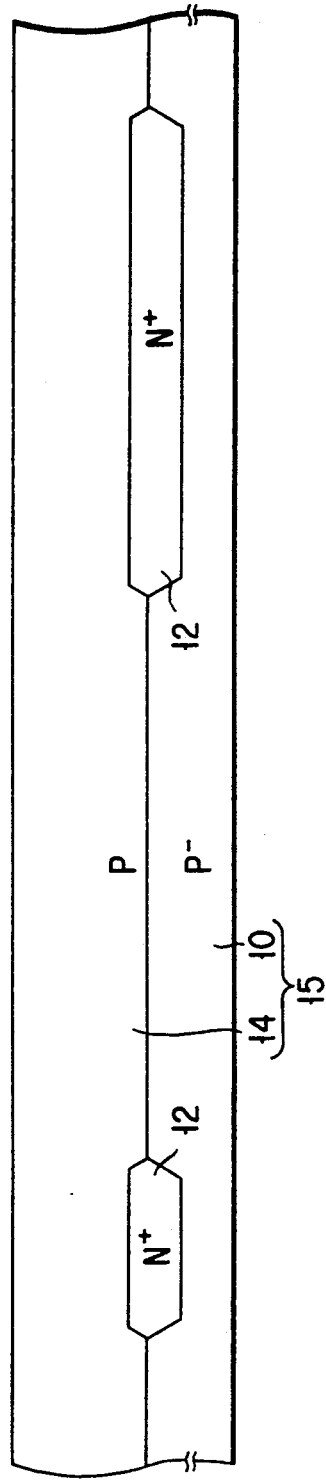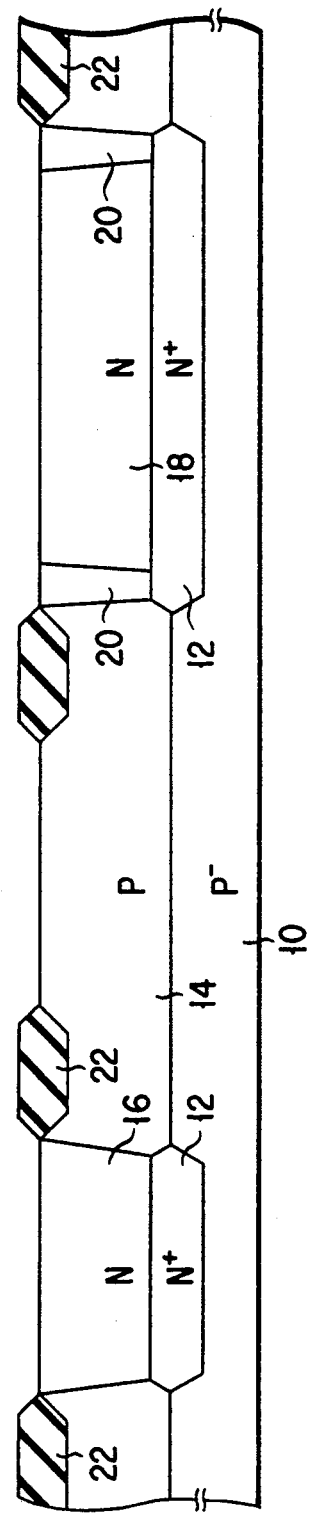
FIG. 1A
FIG. 1B

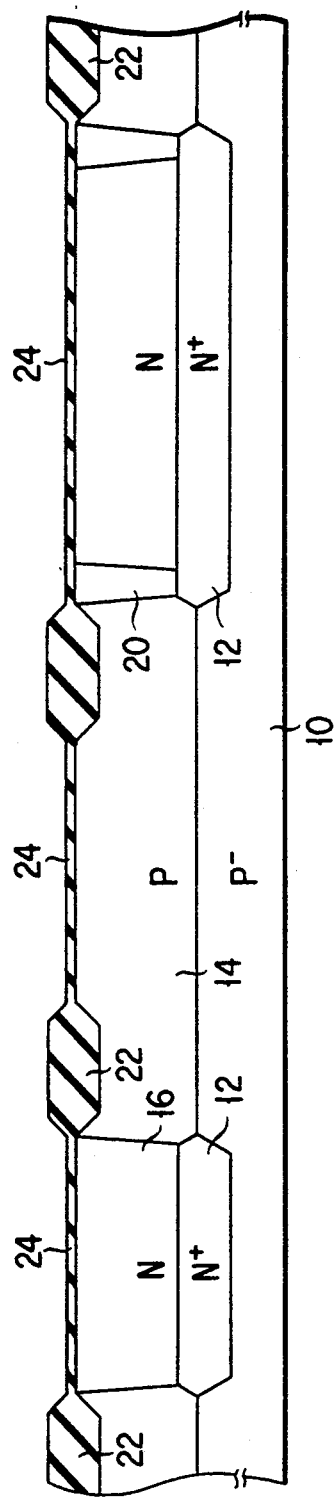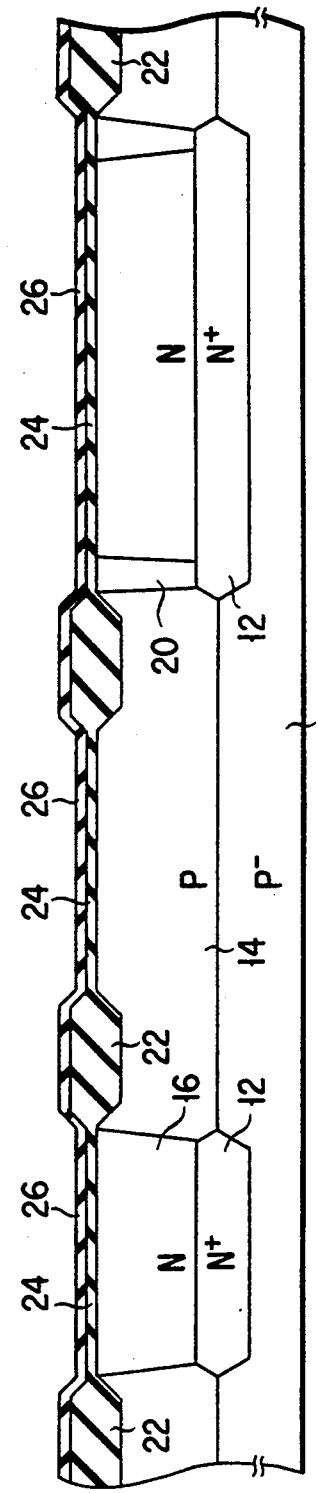

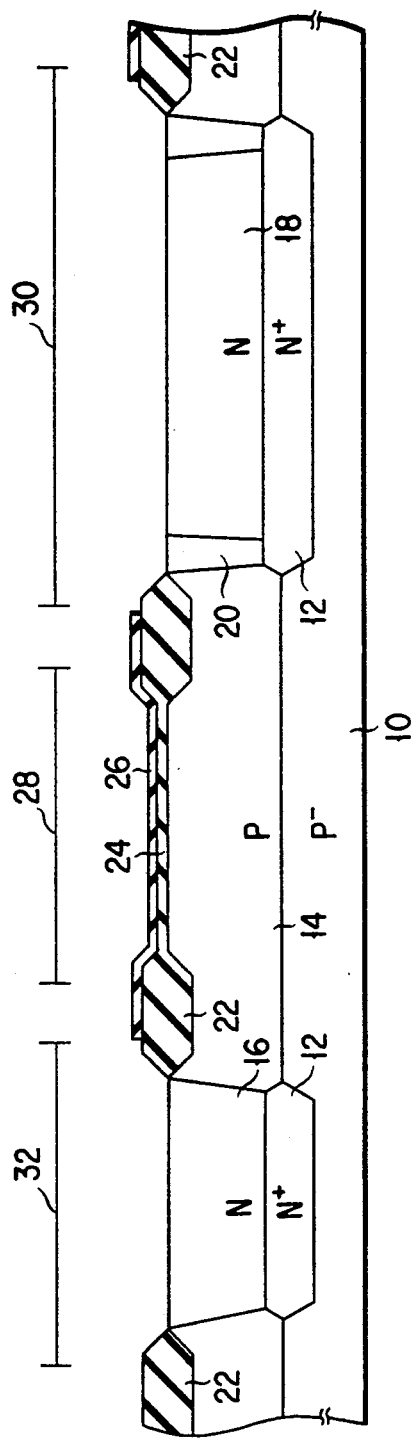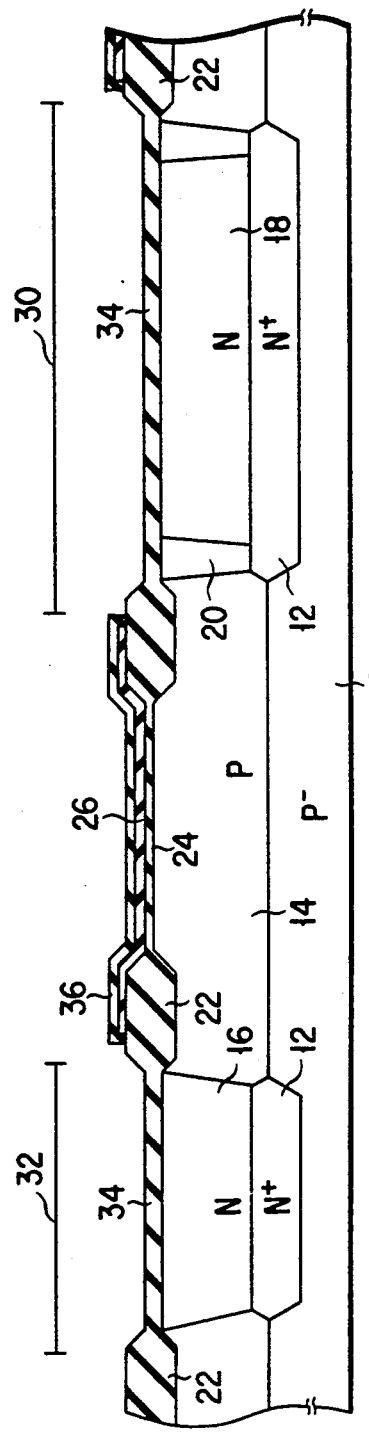

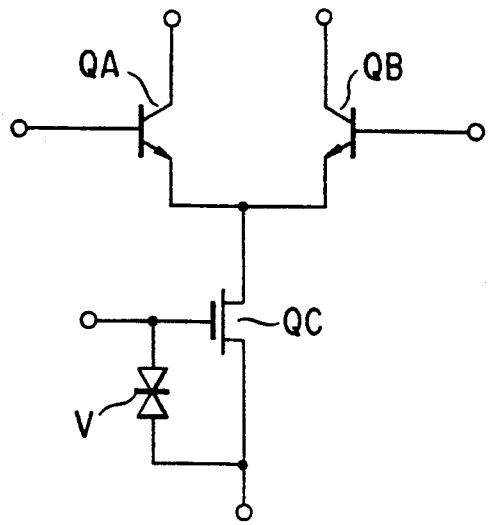
F I G. 3
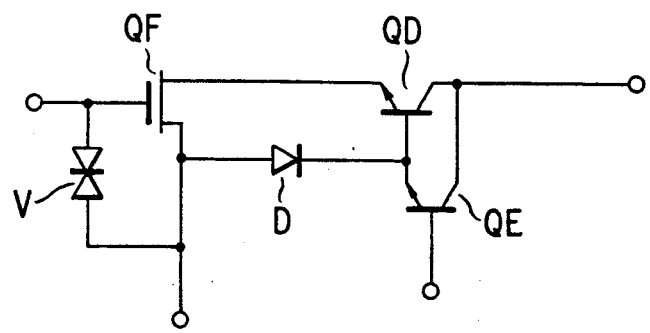
F I G. 4

BI-MOS TYPE SEMICONDUCTOR INTEGRATED CIRCUIT DEVICE HAVING HIGH-FREQUENCY CHARACTERISTICS AND METHOD OF MAKING THE SAME

BACKGROUND OF THE INVENTION

1. Field of the Invention

This invention relates generally to a semiconductor integrated circuit device and a method of making the same, and more particularly to a Bi-MOS type semiconductor integrated circuit device which includes a bipolar transistor and an insulated gate transistor on a semiconductor substrate.

2. Description of the Related Art

FIG. 5 shows a cross-sectional view of a conventional Bi-MOS type semiconductor integrated circuit device (hereinafter abbreviated as Bi-MOS IC) having a bipolar transistor and an insulated gate transistor on a semiconductor substrate.

As shown in FIG. 5, a P-type epitaxial layer 14 is provided on a P$^-$-type silicon substrate 10 having an N$^+$-type buried layer 12. An N-type impurity is diffused into the epitaxial layer 14 down to the buried layer 12 to provide island regions including N-type region 16 and 18, and the remaining P-type region 14. These island regions are electrically isolated by a field oxide film 22. The N-type region 18 serves as a collector region of two bipolar transistors and includes an N$^+$-type collector contact region 20. The P-type region 14 is a region for providing an insulated gate MOS transistor. The N-type region 16 is provided to form diodes, which includes P-type diffused regions 39. The P-type region 14 has N-type LDD regions 58 and N$^+$-type source/drain contact regions 60. The bipolar transistor includes a P$^+$-type outer base region 38 and a P-type inner base region 40 which includes an N$^+$-type emitter region 62. The emitter region 62 is provided with an emitter electrode 54 having a stacked structure composed of an N-type polysilicon layer and a molybdenum silicide layer. The collector contact region 20 includes a collector electrode 52 having the same stacked structure as the emitter electrode 54. Further, a gate electrode 56 having the same stacked structure as the emitter electrode 54 is provided by a gate oxide film 24 on the P-type region 14 located between the N-type LDD regions 58. The surface of the semiconductor substrate is covered with an interlevel insulator 64, in which contact holes reaching the above-mentioned regions are provided. Electrode wiring layers 72, 74, 76, 78, and 80 connected to desired regions are provided through the contact holes.

The Bi-MOS IC having the described structure has been used for various purposes. For example, it is used as an amplifier circuit or a mixer circuit in VHF and UHF bands. For increasing high-frequency characteristics of the Bi-MOS IC, it is desirable to reduce the emitter-base capacitance of the bipolar transistor and the base resistance, thereby increasing the gain-bandwidth product $f_T$. For this purpose, it is necessary to provide the fine pattern structure of the bipolar transistor, more specifically, to reduce the emitter pitch Lp.

However, it is difficult to reduce the emitter pitch Lp in the conventional Bi-MOS IC, because of the following reason.

FIG. 6 shows a method of making the conventional Bi-MOS IC. Contact holes 100 are formed in an insulating film 34 provided on the collector region 18, so as to reach the collector contact region 20 and the inner base region 40. Collector electrodes 52, emitter electrodes 54 and the gate electrode 56, which are composed of the doped polysilicon layer and the metal silicide, are provided on respective regions through the contact holes. Thereafter, the interlevel insulator 64 is formed on the collector region 18 as shown in FIG. 7. Contact holes 102 are formed in the interlevel insulator 64 so as to reach the outer base regions 38, the emitter electrodes 54, and the collector electrodes 52.

As described above, since the contact holes 100 for providing the emitter electrodes and the contact holes 102 for obtaining the base electrodes are formed by different process steps, a mask alignment margin and an etching margin must be taken into account. Therefore, it is difficult to reduce the emitter pitch Lp, thereby reducing the emitter-base capacitance and the base resistance, in order to improve the gain-bandwidth product $f_T$.

SUMMARY OF THE INVENTION

Accordingly, an object of the present invention is to provide a Bi-MOS type semiconductor integrated circuit device which includes bipolar transistors having high-frequency characteristics.

Another object of the present invention is to provide bipolar transistors adapted to a Bi-MOS type semiconductor integrated circuit device and having a reduced emitter pitch.

Still another object of the present invention is to provide a method of making a Bi-MOS type semiconductor integrated circuit device including bipolar transistors having high-frequency characteristics.

According to an aspect of the present invention, there is provided a Bi-MOS type semiconductor integrated circuit device, which comprises a semiconductor body including first and second island regions isolated from each other, at least one bipolar transistor having collector, base and emitter regions and provided in the first island region, a multilayer insulating film comprised of first and second insulating films having different etching resistance, the multilayer insulating film being provided over the first island region, an electrode disposed on the multilayer insulating film so as to be in ohmic contact with the collector, base and emitter regions through a contact hole formed in the multilayer insulating film, an insulated gate MOS transistor including source and drain regions and a gate electrode and provided in the second island region, and a protective film formed over a gate insulating film, the gate electrode being provided on the protective film.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 1A to 1K are cross-sectional views showing, in sequence, process steps of making a semiconductor integrated circuit device according to an embodiment of the present invention;

FIG. 3 is a diagram showing a first high-frequency circuit by using the semiconductor integrated circuit device of the present invention;

FIG. 4 is a diagram showing a second high-frequency circuit by using the semiconductor integrated circuit device of the present invention;

DETAILED DESCRIPTION OF THE PREFERRED EMBODIMENTS

Figure 1G:
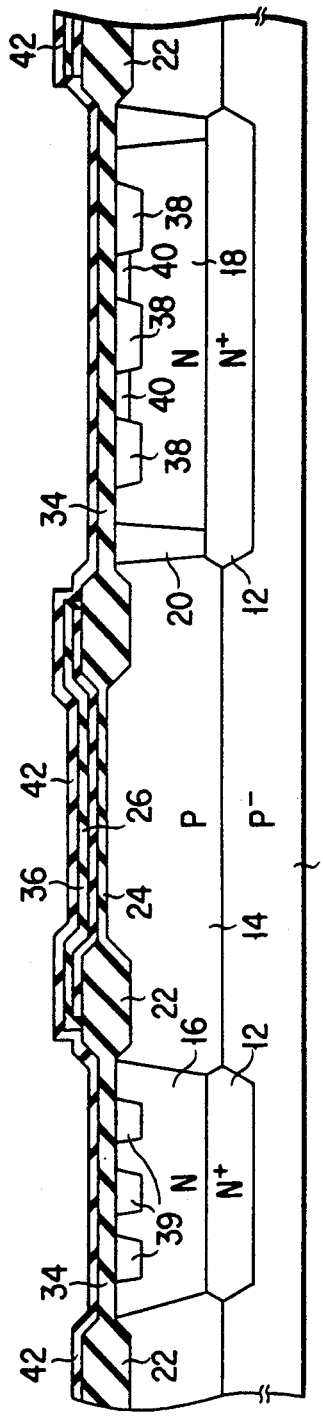

An embodiment of the present invention will be described with reference to FIGS. 1A to 1K. In the drawings, like parts are identified by the same reference numerals.

As shown in FIG. 1A, an N+-type buried layer 12 containing antimony of about $5 \times 10^{19}$ cm$^{-3}$ is formed in a P−-type silicon substrate 10 containing boron of about $8 \times 10^{14}$ cm$^{-3}$. Thereafter, a P-type epitaxial layer 14 containing boron of about $2 \times 10^{15}$ cm$^{-3}$ and having a thickness of about 2 μm is grown on the P−-type silicon substrate 10. A semiconductor body 15 for forming semiconductor elements is provided by the silicon substrate 10 and the epitaxial layer 14.

As shown in FIG. 1B, an N-type impurity is selectively implanted into the epitaxial layer 14 to define a P-type island region 14 for providing an insulated gate MOS transistor, an N-type island region 16 for providing diodes, and an N-type island region 18 for providing bipolar transistors, respectively. Further, an N-type impurity is implanted into the N-type island region 18 to provide N+-type collector contact regions 20 therein.

The ion-implantation for forming the N-type island region 16 is carried out at the acceleration voltage of 70 KeV and the dose of $2.0 \times 10^{13}$ cm$^{-2}$, using phosphorus as the impurity.

The ion-implantation for making the N-type island region 18 is accomplished at the acceleration voltage of 70 KeV and the dose of $1.9 \times 10^{12}$ cm$^{-2}$, using phosphorus as the impurity.

The ion-implantation for forming the N-type collector contact regions 20 is carried out at the acceleration voltage of 50 KeV and the does of $2.0 \times 10^{15}$ cm$^{-2}$, using phosphorus as the impurity.

The semiconductor body 15 is heat-treated in a nitrogen atmosphere at a temperature of 1100° C. for three hours. Thereafter, a field oxide film 22 having a thickness of about 1000 nm is provided by LOCOS techniques.

As shown in FIG. 1C, the exposed substrate surface is oxidized to provided an oxide film 24, which serves as a gate oxide film of an MOSFET.

As shown in FIG. 1D, a nondoped or doped polysilicon film 26 is deposited on the oxide film 24. The polysilicon film 26 serves as a protective film for keeping the thickness of the oxide film 24 constant in a process of removing a natural oxide film from the substrate surface, protecting the gate oxide film 24 from contaminations in various steps. As the protective film 26, it is possible to use high melting point metals such as Mo, Ti, W, etc., silicides of these metals such as MoSi, TiSi, WSi, etc., and nitrides of these metals such as TiN, etc., instead of the polysilicon film.

As shown in FIG. 1E, the polysilicon film 26 is selectively removed from a bipolar transistor area 30 and a diode area 32 except for a MOSFET area 28.

As shown in FIG. 1F, the exposed substrate surface is oxidized to form oxide films 34 and 36. These oxide films have a thickness of, for example, about 100 nm.

As shown in FIG. 1G, for example, boron is selectively implanted into the N-type island regions 16 and 18 through the oxide film 34 under conditions of the acceleration voltage of 40 KeV and the dose of $3.0 \times 10^{15}$ cm$^{-2}$. Thereafter, a heat-treatment is performed in a nitrogen atmosphere at a temperature of 1000° C. for 30 minutes, thereby forming P+-type outer base regions 38 and P+-type regions 39 therein. Further, for example, boron is selectively implanted into the N-type island region 18 through the oxide film 34 under the conditions of the acceleration voltage of 35 KeV and the dosage of $4.0 \times 10^{13}$ cm$^{-2}$. Thereafter, a heat-treatment is performed in a nitrogen atmosphere at the temperature of 800° C. for 30 minutes, thereby forming a P-type inner base region 40. After these ion-implantation steps, a silicon nitride film 42 having a thickness of about 100 nm is deposited on the substrate surface by, for example, CVD techniques.

Figure 1H:
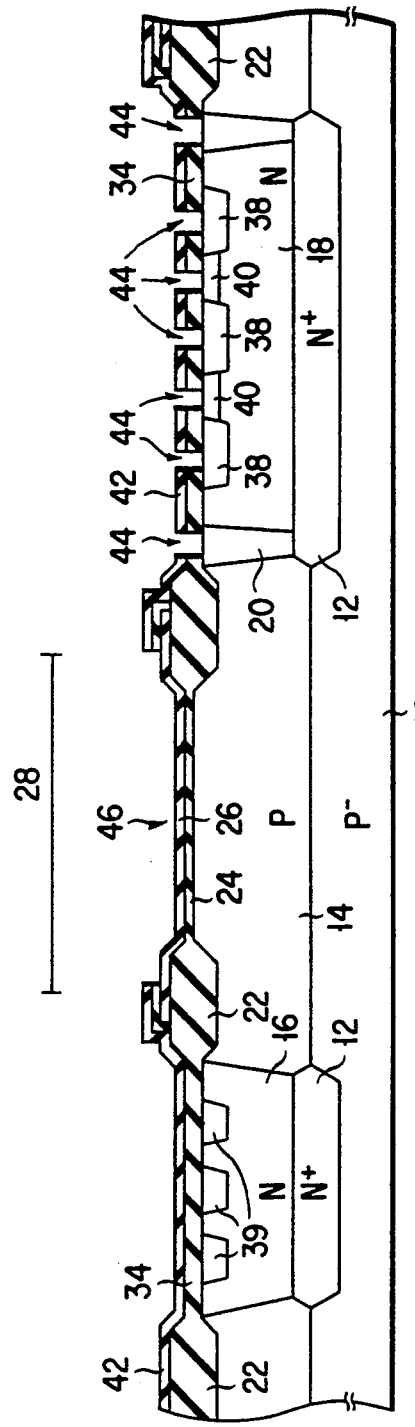

As shown in FIG. 1H, the silicon nitride film 42 and the silicon oxide film 34 are selectively removed from the N+-type collector contact region 20, the P+-type outer base region 38, the P-type inner base region 40, and the MOSFET area 28, using a resist pattern (not shown) as a mask. As a result, fine contact holes 44 reaching the collector contact region 20, the P+-type outer base region 38, and the P-type inner base region 40 are provided. In addition, a window 46 for exposing the polysilicon layer 26 is formed in the MOSFET area 28.

Figures 1I, 1J:
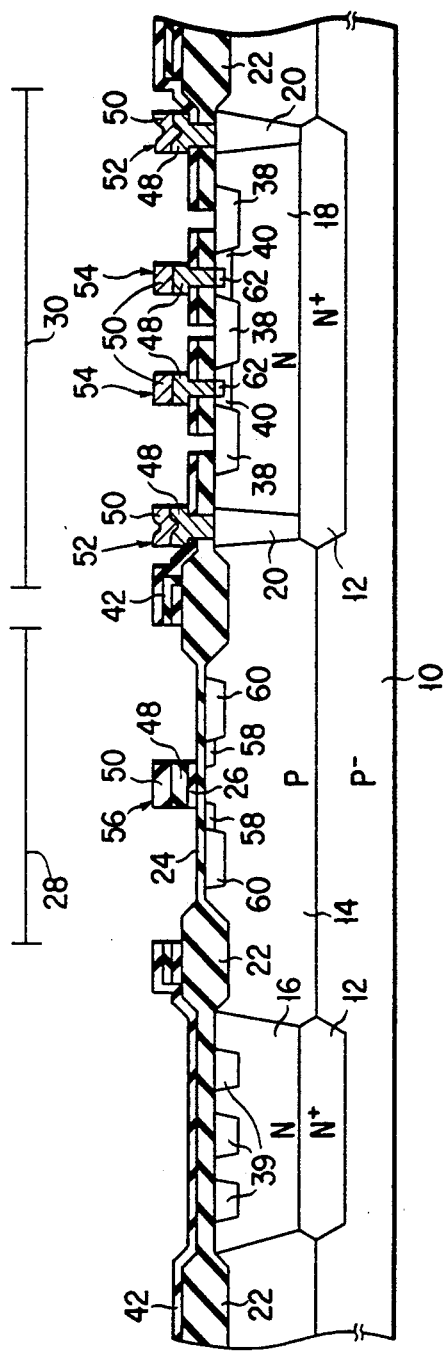

As shown in FIG. 1I, an arsenic doped polysilicon layer 48 and a molybdenum silicide layer 50 are continuously deposited. Thereafter, the molybdenum silicide layer 50 and the polysilicon layer 48 ar patterned by photoetching, thus forming collector electrodes 52, emitter electrodes 54 and a gate electrode 56, each of which has a stacked structure including the molybdenum silicide layer 50 and the polysilicon layer 48. Thereafter, for example, phosphorus is selectively ion-implanted into the MOSFET area 28 at the acceleration voltage of 60 KeV and the dose of $2.0 \times 10^{14}$ cm$^{-2}$, thereby forming LD regions 58. Then, for example, arsenic is selectively ion-implanted into the MOSFET area 28 at the acceleration voltage of 40 KeV and the dose of $5.0 \times 10^{15}$ cm$^{-2}$, thereby forming source/drain regions 60. After the ion implantation steps, a heat-treatment is accomplished, with the result that the arsenic doped in the polysilicon layer 48 is diffused into the P-type base region 40, thereby providing emitter regions 62. In this case, the emitter and collector electrodes 54 and 52 of the bipolar transistor and the gate electrode 56 of the MOSFET are provided by the stacked structure including the doped polysilicon layer 48 and the molybdenum silicide layer 50. However, these electrodes may be provided by only one layer composed of high melting point metals, silicides of the these metals, etc.

As shown in FIG. 1J, an oxide film 64 is deposited to a thickness of about 800 nm on the substrate surface by, for example, CVD techniques as an interlevel insulator. Next, a heat-treatment is performed in a nitrogen atmosphere for an appropriate period of time, thereby controlling the current amplification factor hFE of the bipolar transistors. Thereafter, the oxide film 64 is selectively removed, using a resist pattern (not shown) as a mask. As a result, contact holes 66 reaching the P+-type regions 39 of diodes and contact holes 68 reaching the source/drain regions 60 are provided in the oxide film 64. A window 70 is formed in the oxide film 64 of the bipolar transistor area 30 so as to expose the silicon nitride film 42, the emitter electrodes 54, the collector electrodes 52, and the contact holes 44 reaching the outer base regions 38.

As is apparent from the step described above, since the nitride film 42 is provided on the oxide film 34, the oxide film 34 is not etched at all and the fine contact holes 44 reaching the outer base regions 38 are exposed when the window 70 is formed in the interlevel insulator. In other words, since the fine contact holes 44 reaching the outer base regions 38 are previously formed in the multilayer insulating film constituted by the oxide film 34 and the nitride film 42, it is unnecessary to form fine contact holes 44 in the thick interlevel insulator 64.

Figure 1K:
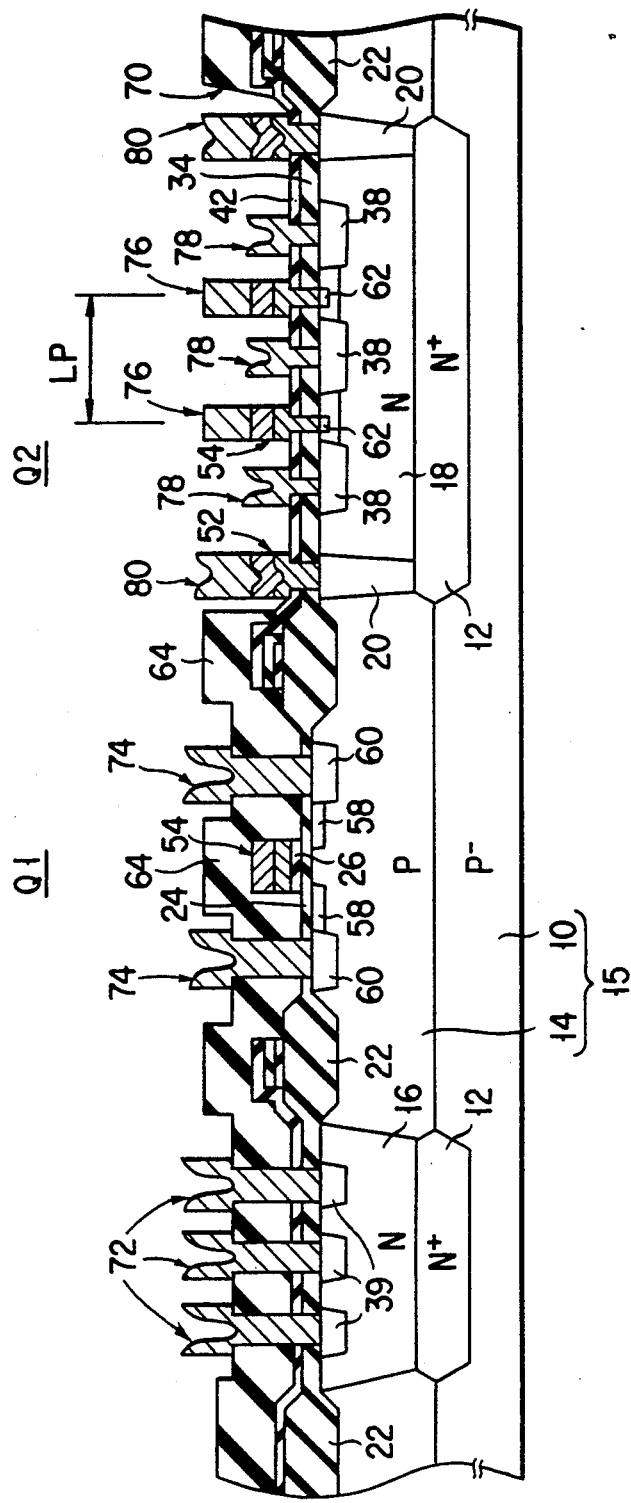

As shown in FIG. 1K, an aluminum film is deposited to a thickness of about 2 μm on the substrate surface by sputtering techniques. The aluminum film is patterned to form an electrode wiring layer 72 electrically connected to the P+-type regions 39, an electrode wiring layer 74 electrically connected to the source/drain regions 60, an electrode wiring layer 76 electrically connected to the emitter regions 62, an electrode wiring region 78 electrically connected to the P+-type base regions 38, and an electrode wiring regions 80 electrically connected to the collector contact regions 20, respectively.

As is apparent from the embodiment, the present invention has the following advantages:

(1) Since fine contact holes 44 required for making the bipolar transistors, i.e., collector contact holes, base contact holes, emitter contact holes, and the like have been previously provided in the multilayer insulating film constituted by the oxide film 3 and the silicon nitride film 42, the mask alignment margin will not be required among the contact holes. Therefore, the bipolar transistors Q2 having the fine pattern structure can be provided to reduce the emitter pitch Lp. For example, bipolar transistors manufactured by the conventional method has the emitter pitch of about 18 μm and the gain-bandwidth product $f_T$ of about 4 GHz, whereas the bipolar transistors of the embodiment has the emitter pitch Lp of about 5.4 μm and the gain-bandwidth product fT of about 10 GHz.

(2) Since the gate oxide film 24 of the MOS transistor Q1 is formed in the initial process step such that the substrate is kept at the high cleanliness level, the film quality is satisfactory. In addition, since the gate oxide film 24 is quickly covered with the polysilicon layer 26, the gate oxide film 24 is not contaminated by unwanted impurities during the manufacturing process even when the gate electrode 56 is later provided thereon. Therefore, the gate oxide film 24 is maintained at the good film quality to provided the MOS transistor having high reliability.

Figure 2:
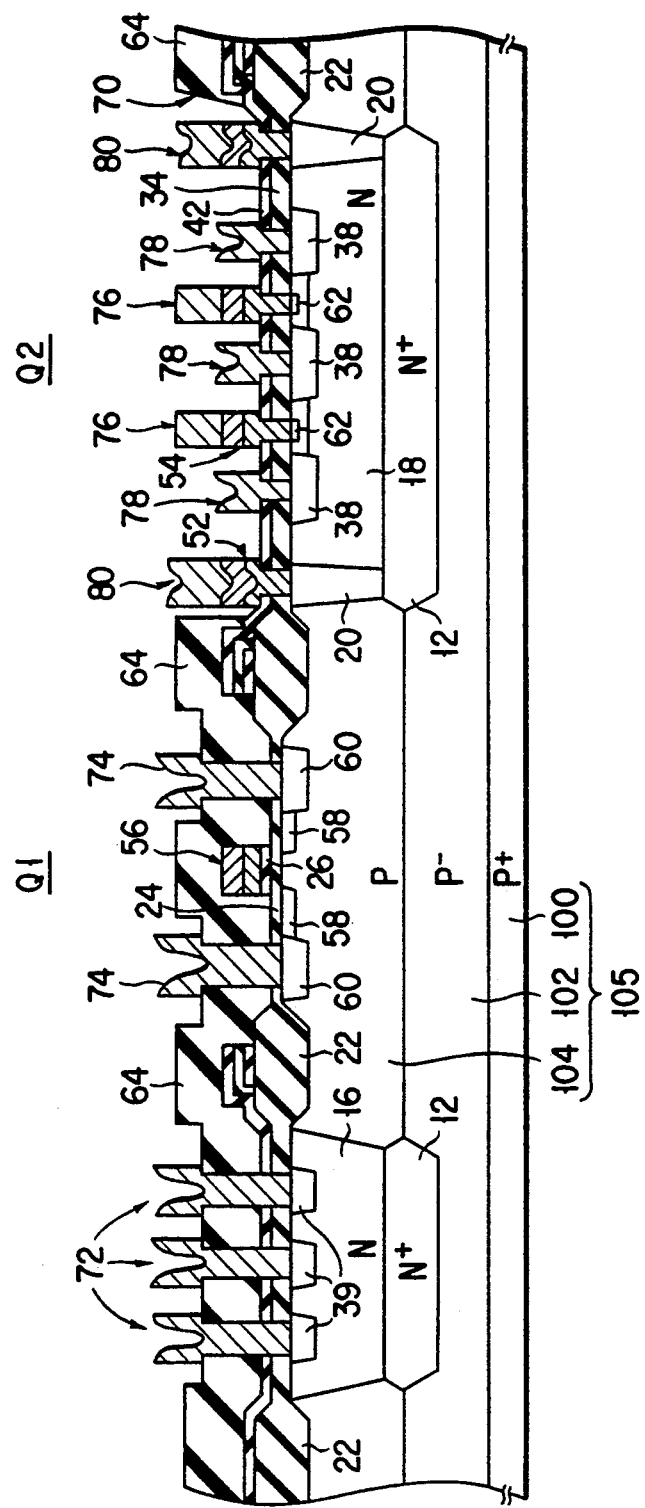
FIG. 2 is a cross-sectional view showing a modification of the semiconductor integrated circuit device according to the embodiment.
Figure 5:
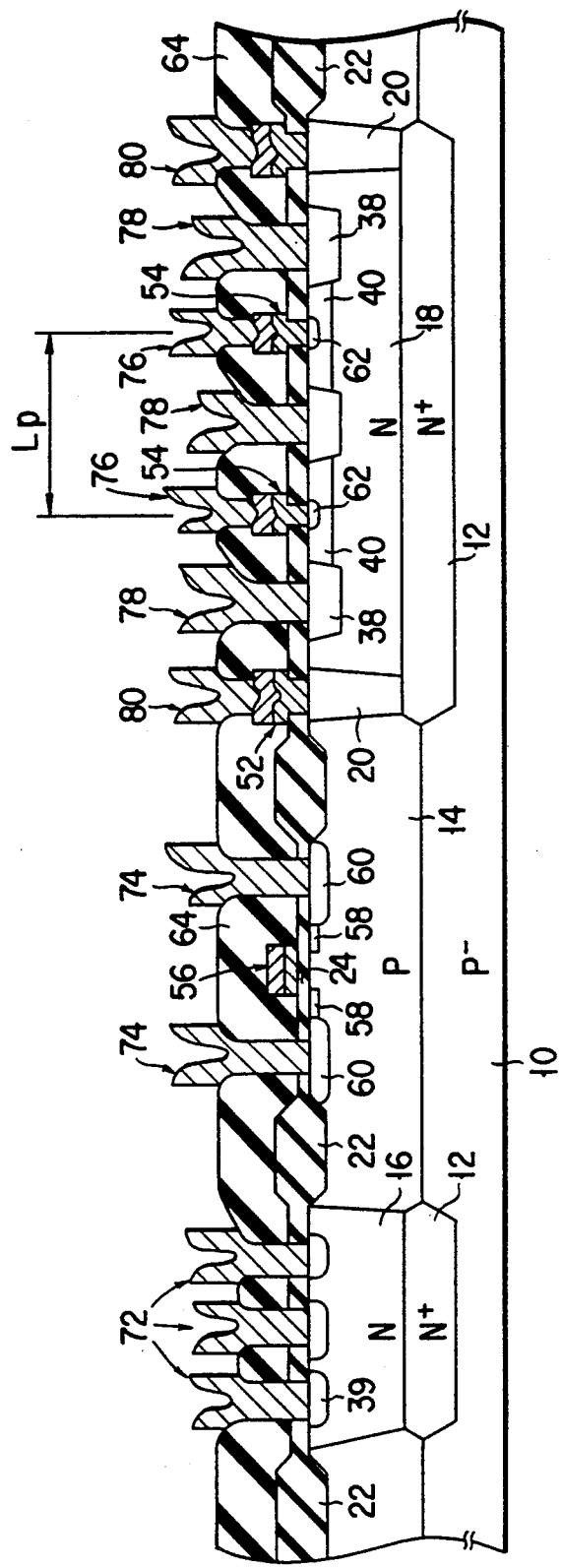
FIG. 5 is a cross-sectional view showing a conventional semiconductor integrated circuit device.
Figure 6:
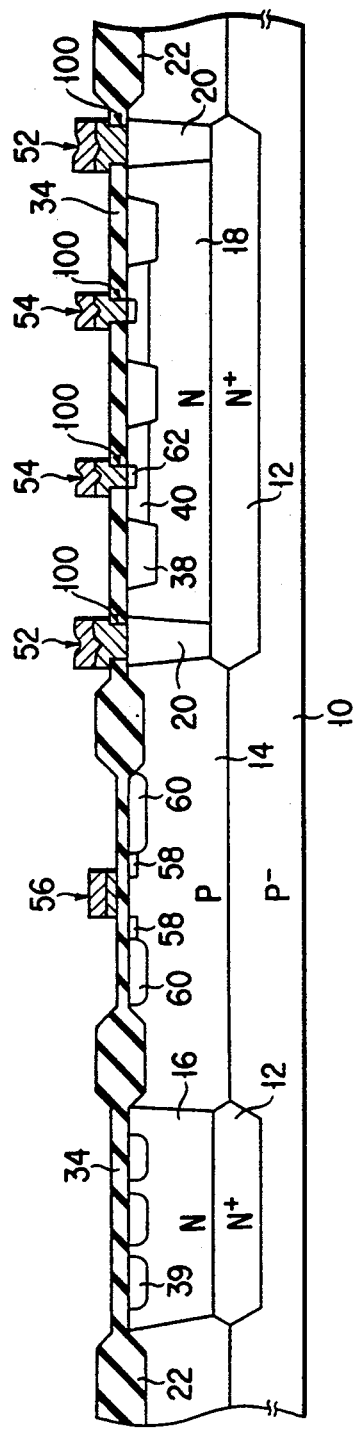
FIGS. 6 and 7 are cross-sectional views showing conventional steps of making a semiconductor integrated circuit device.
Figure 7:
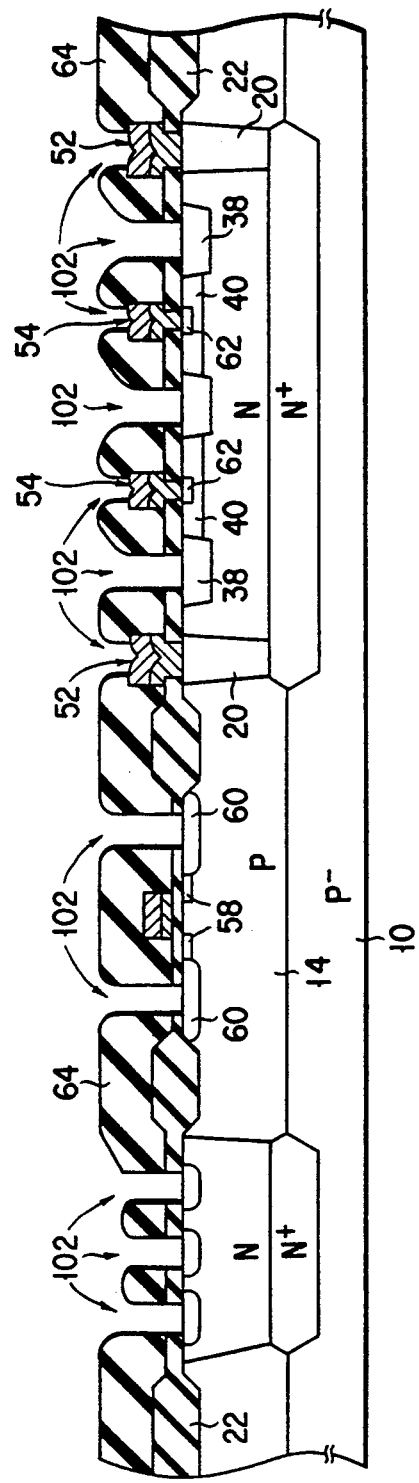

FIG. 2 is a cross-sectional view of a semiconductor integrated circuit device showing a modification of the embodiment. In FIG. 2, the parts similar to those described with reference to FIG. 1K are identified by the same reference numerals. Therefore, different portions will be described.

As shown in FIG. 2, a semiconductor body 105 for providing semiconductor elements is constituted by a P+-type silicon substrate 100, a P−-type epitaxial layer 102 grown thereon, and a P-type epitaxial layer 104 grown on the layer 102. The buried layer 12 is formed between the epitaxial layers 102 and 104.

According to structure, since the ground resistance of the device is reduced, the high-frequency characteristics of the MOSFET Q1 are improved.

FIGS. 3 and 4 show high-frequency circuits provided by using the semiconductor integrated circuit device according to the present invention.

FIG. 3 shows a mixer circuit for use in VHF and UHF bands. In this circuit, the emitters of two bipolar transistors $Q_A$ and $Q_B$ are connected to each other at a connection point, to which the drain of the MOSFET QC is connected. A protective diode V is interposed between the gate and the source of the MOSFET $Q_C$ to prevent electrostatic breakdown of the gate.

In the high-frequency circuit of FIG. 3, if the bipolar transistors $Q_A$ and $Q_B$ are provided by the bipolar transistors Q2 as described in the embodiment and the MOSFET $Q_C$ is provided by the MOSFET Q1, the high-frequency circuit can be constituted by bipolar transistors having high-frequency characteristics and the highly reliable MOSFET.

FIG. 4 shows an amplifier circuit for use in VHF and UHF bands. In this circuit, the collectors of two bipolar transistors $Q_D$ and $Q_E$ are connected to each other. The emitter of the bipolar transistor $Q_E$ is connected to the base of the bipolar transistor $Q_D$, and the emitter of the bipolar transistor $Q_D$ is connected to the drain of the MOSFET $Q_F$. A protective diode V is interposed between the gate and the source of the MOSFET $Q_F$.

In the high-frequency circuit of FIG. 4, if the bipolar transistors $Q_D$ and $Q_E$ are provided by the bipolar transistor Q2 as described in the embodiment and the MOSFET $Q_F$ is provided by the MOSFET Q1, the high-frequency circuit can be constituted by bipolar transistors having high-frequency characteristics and a reliable MOSFET.

It is further understood by those skilled in the art that the foregoing description is only of the preferred embodiment and that various changes and modifications may be made in the invention without departing from the spirit and scope thereof.

What is claimed is:

1. A method of making a Bi-MOS type semiconductor integrated circuit device comprising the steps of:
   (a) preparing a semiconductor body of one conductivity type having a major surface;
   (b) selectively introducing an impurity of an opposite conductivity type into said semiconductor body to define a first island region of opposite conductivity type therein, a residual area of said semiconductor body being used as a second island region for providing an insulated gate MOS transistor, said first island region serving as a collector region of a bipolar transistor;
   (c) forming a first insulating film over said major surface;
   (d) depositing a protective film over said first insulating film;
   (e) selectively removing said first insulating film and said protective film from said first island region;
   (f) forming a second insulating film over an exposed surface of said first island region;

(g) selectively introducing an impurity of one conductivity type into said first island region to provide a base region of said bipolar transistor;
(h) depositing a third insulating film over said major surface, an etching resistance of said third insulating film being different from that of said second insulating film;
(i) selectively etching said third and second insulating films down to said exposed surface of said first island region to provide a collector contact hole, a base contact hole and a contact hole of an intended emitter region, while removing said third insulating film from said second island region to expose said protective film;
(j) successively forming a doped polysilicon film and a metal silicide film over said major surface;
(k) patterning said metal silicide film and said doped polysilicon film to form an emitter region of an opposite conductivity type in said base region and to provide a collector electrode, an emitter electrode and a gate electrode at the same time;
(l) selectively introducing an impurity of an opposite conductivity type into said second island region to provide source and drain regions therein;
(m) depositing an interlevel insulator over said major surface;
(n) selectively etching said interlevel insulator to form contact hoes for said source and drain regions, while removing it from said first island regions to expose said base contact hole;
(o) depositing a metal film over said major surface; and
(p) patterning said metal film to provide a base electrode and source and drain electrodes at the same time.

2. The method according to claim 1, wherein said second insulating film is composed of a silicon oxide film.

3. The method according to claim 1, wherein said third insulating film is composed of a silicon nitride film.

4. The method according to claim 1, wherein said protective film is composed of a polysilicon film.

5. The method according to claim 1, wherein said protective film is composed of a high melting point material, 6. The method according to claim 1, wherein the step of selectively introducing an impurity of an opposite conductivity type into said semiconductor body provides third island region of opposite conductivity type to form a diode therein.

7. The method according to claim 1, further including a step of:
heat-treating said semiconductor body in a nitrogen atmosphere to control a current amplification factor $h_{FE}$ after the step of (m) depositing an interlevel insulator over said major surface.

8. The method according to claim 1, wherein two bipolar transistors are formed in said first island region.

* * * * *